United States Patent [19]
Stanford et al.

[11] Patent Number: 5,244,000
[45] Date of Patent: Sep. 14, 1993

[54] METHOD AND SYSTEM FOR REMOVING CONTAMINANTS

[75] Inventors: Thomas B. Stanford, San Pedro; Richard C. George, Jr., Topanga; Jennifer I. Shinno, Canoga Park; Dhiren C. Mehta, Cypress; Gifford W. Rodine, El Segundo, all of Calif.

[73] Assignee: Hughes Aircraft Company, Los Angeles, Calif.

[21] Appl. No.: 918,082

[22] Filed: Jul. 24, 1992

Related U.S. Application Data

[62] Division of Ser. No. 791,819, Nov. 13, 1991.

[51] Int. Cl.$^5$ .............................. B08B 3/08
[52] U.S. Cl. .................. 134/95.1; 134/102.1; 134/2
[58] Field of Search ........... 134/26, 27, 28, 29, 134/102.1, 95.1, 2, 3

[56] References Cited

U.S. PATENT DOCUMENTS

| | | | |
|---|---|---|---|
| 3,413,160 | 11/1968 | Teumac | 134/2 X |
| 3,951,710 | 4/1976 | Basi | 134/2 X |
| 4,443,268 | 4/1984 | Cook | 134/29 X |
| 4,578,162 | 3/1986 | McIntyre et al. | 134/2 |
| 4,747,907 | 5/1988 | Acocella et al. | 134/2 X |
| 4,806,192 | 2/1989 | Haas | 134/2 X |
| 4,942,594 | 7/1990 | Bertholdt et al. | 134/2 X |
| 5,076,885 | 12/1991 | Haas et al. | 134/27 X |
| 5,164,016 | 11/1992 | Henriet et al. | 134/2 |

FOREIGN PATENT DOCUMENTS

| | | |
|---|---|---|
| 0053719 | 6/1982 | European Pat. Off. |
| 1914759 | 10/1970 | Fed. Rep. of Germany ... 134/2 |
| 52-76232 | 6/1977 | Japan .................. 134/2 |
| 57-204132 | 12/1982 | Japan .................. 134/2 |
| 8809368 | 12/1988 | PCT Int'l Appl. |
| 9109987 | 7/1991 | PCT Int'l Appl. |

*Primary Examiner*—Frankie L. Stinson
*Attorney, Agent, or Firm*—Mary E. Lachman; M. W. Sales; W. K. Denson-Low

[57] ABSTRACT

A method for removing contaminants from a solid substrate comprising, in a preferred embodiment:
(a) providing an initial reaction bath comprising:
  (1) an alkaline compound in sufficient amount to provide a pH of 10.5 to 14.0 in the final reaction bath;
  (2) a chosen wetting agent which is stable in the presence of the alkaline compound and hydrogen peroxide; and
  (3) deionized water;
(b) metering hydrogen peroxide into the initial and final reaction baths at a rate of about 0.004 milligrams of hydrogen peroxide per minute per gallon of reaction bath fluid or higher;
(c) sparging the initial and final reaction baths with air or oxygen at a rate of about 0.001 to 1 standard cubic feet per minute; and
(d) exposing the substrate having contaminants to the final reaction bath containing metered hydrogen peroxide and sparging air or oxygen. The hydrogen peroxide in the final reaction bath is maintained at an effective level for an extended period of time to remove said contaminants from the substrate in a uniform and controlled manner. Alternatively, other oxidants besides hydrogen peroxide may be used. A system for accomplishing this method is also disclosed.

23 Claims, 3 Drawing Sheets

METHOD AND SYSTEM FOR REMOVING CONTAMINANTS

This is a division of application Ser. No. 07/791,819 filed Nov. 13, 1991 still pending.

BACKGROUND OF THE INVENTION

1. Field of the Invention

The present invention relates generally to a method and system for removing contaminants from solid substrates. More particularly, the present invention relates to such a method and system for use with an oxidant such as a hydrogen peroxide composition for removing contaminants such as solder flux and ionic species.

2. Description of the Background Art

Solder is used in the assembly of printed circuit boards, integrated circuits, and various electronic components and devices, in order to join metal parts together. The solder itself comprises an alloy, such as of indium or tin and lead. Before application of the solder to the metal surface, the surface is treated with a fluxing agent to remove oxides and other contaminants which might interfere with the metal joining, and to prevent reformation thereof during the solder process. These fluxing agents are typically organic materials, such as natural rosin extracted from pine tree sap, organic acids such as carboxylic acid, amines and amides, or inorganic materials, such as inorganic acids or salts. The most commonly used fluxing agent is acid rosin flux. The term "rosin flux" is used herein to mean a flux material which comprises rosin, i.e., the resin after distilling turpentine from the exudation of species of pine, and containing abietic acid and its anhydride. Typically, a small amount of another acid is added to rosin flux to activate it and such compositions are referred to as "acid rosin flux" or "rosin activated flux." After the solder operation has been completed, excess flux as well as flux residues remain on the soldered surface, and these residues are resinous, waxy, corrosive and conductive. These flux residues and excess flux must be removed prior to subsequent processing steps in order to prevent reaction thereof with the soldered parts, leading to corrosion and resultant electrical insulation losses. In particular, any ionic species, such as those derived from adipic acid or halogens, are electrically conductive and would degrade electronic circuit performance if not removed. These ionic species are carried by the organic flux residue.

Defluxing agents which are currently widely used are halogenated hydrocarbons such as 1,1,1-trichloroethane and Freon (a tradename of E. I. DuPont de Nemours for polyhalogenated hydrocarbons including chlorine and fluorine). While these organic materials are effective defluxing solvents, they have the serious disadvantage that they have a negative impact on the environment due to ozone depletion. Recent environmental legislation mandates that the production of these materials be severely restricted in the next few years and eventually eliminated. When these materials are used, even in small quantities, expensive management systems for transport, storage, use, and disposal and environmental protection equipment must be used to prevent air and water discharges. In addition, waste solvents require energy-intensive regeneration operations for these materials.

Numerous aqueous cleaners are available which are viable defluxing solvents; however, none of these has been found to be meet the stringent cleaning and compatibility requirements of a high reliability electronic assembly defluxing solvent. This is particularly relevant to assemblies with close tolerance spaces. In addition, the resulting organic-laden aqueous solvents require further processing before disposal.

Thus, an urgent need exists in the electronics industry for a solvent which effectively removes flux residues and contaminants while at the same time avoiding any negative environmental impact. Such a solvent would also be useful for removing other contaminants from other substrates. These requirements are met by the composition and method described in copending patent application Ser. No. 07/700,353, filed May 7, 1991, and copending patent application Ser. No. 07/583,911, filed Sep. 27, 1990, both of which are assigned to the present assignee. In accordance with the invention described in the latter two patent applications, there is first provided a composition comprising: (a) hydrogen peroxide in the amount of about 3 to 5 percent by weight of said composition; (b) an alkali metal hydroxide in sufficient amount to provide a pH of at least 10.5 in said composition; (c) a chosen wetting agent in the amount of about 0.1 to 0.3 percent by weight of said composition, said wetting agent being unreactive with said hydrogen peroxide and said alkali metal hydroxide; and (d) purified water as the balance of said composition. The solid substrate having organic contaminants thereon is exposed to the above-noted composition whereby the organic contaminants are removed from the substrate and are converted into non-toxic and non-hazardous products. Thus, negative environmental impact is avoided by this process. While this composition and method work well for their intended purpose, it would be desirable to provide still further modifications and improvements to them for greater efficiency and reduced cost.

SUMMARY OF THE INVENTION

The general purpose of the present invention is to provide a new and improved method and system for removing contaminants from a chosen solid substrate using a chosen oxidant, such as a hydrogen peroxide composition which avoids negative environmental impact. This method and system possess the advantages of the prior processes while overcoming their significant disadvantages or further enhancing their advantages.

The above general purpose of this invention is accomplished by:

(a) providing an initial reaction bath comprising a chosen liquid reaction medium for a chosen oxidant;

(b) metering the chosen oxidant into the initial reaction bath to form the final reaction bath and metering the chosen oxidant into the final reaction bath at a predetermined rate which is sufficient to provide effective levels of the oxidant in the final reaction bath, where the chosen oxidant comprises a material which reacts with the contaminant to remove it from the substrate without adversely affecting the substrate; and (c) exposing the substrate having said contaminants to the final reaction bath containing the metered oxidant whereby the oxidant in the final reaction bath is maintained at an effective level for an extended period to time to thereby remove the contaminants from the substrate in a uniform and controlled manner. Optionally, the final reaction bath is heated during the exposure of the substrate. As a further option, the initial and final reaction baths may be sparged with air or oxygen at a predetermined rate, and the sparging is maintained during the exposure step. In a preferred embodiment, the oxidant comprises hydrogen peroxide and the initial reaction bath comprises:

(1) an alkaline compound in sufficient amount to provide a pH of 10.5 to 14.0 in the final reaction bath;
(2) a chosen wetting agent which is stable in the presence of the alkaline compound and hydrogen peroxide; and
(3) deionized water;

The system for accomplishing the above-described method comprises: (a) a reaction bath chamber containing the composition in step (a) above; and (b) means connected to the chamber for continuously metering the oxidant into the initial and final reaction baths. The system may optionally include means for heating the final reaction bath. Alternatively, the system may include means connected to the chamber for sparging air or oxygen into the initial and final reaction baths. This system may further comprise post-treatment means for neutralizing residual alkali, rinsing, and drying the treated substrate. In alternative embodiments, the system may further comprise spraying means submerged in the cleaning chamber with the contaminated substrate, located above the reaction bath or submerged in the reaction bath.

DESCRIPTION OF THE PREFERRED EMBODIMENTS

Figure 1:
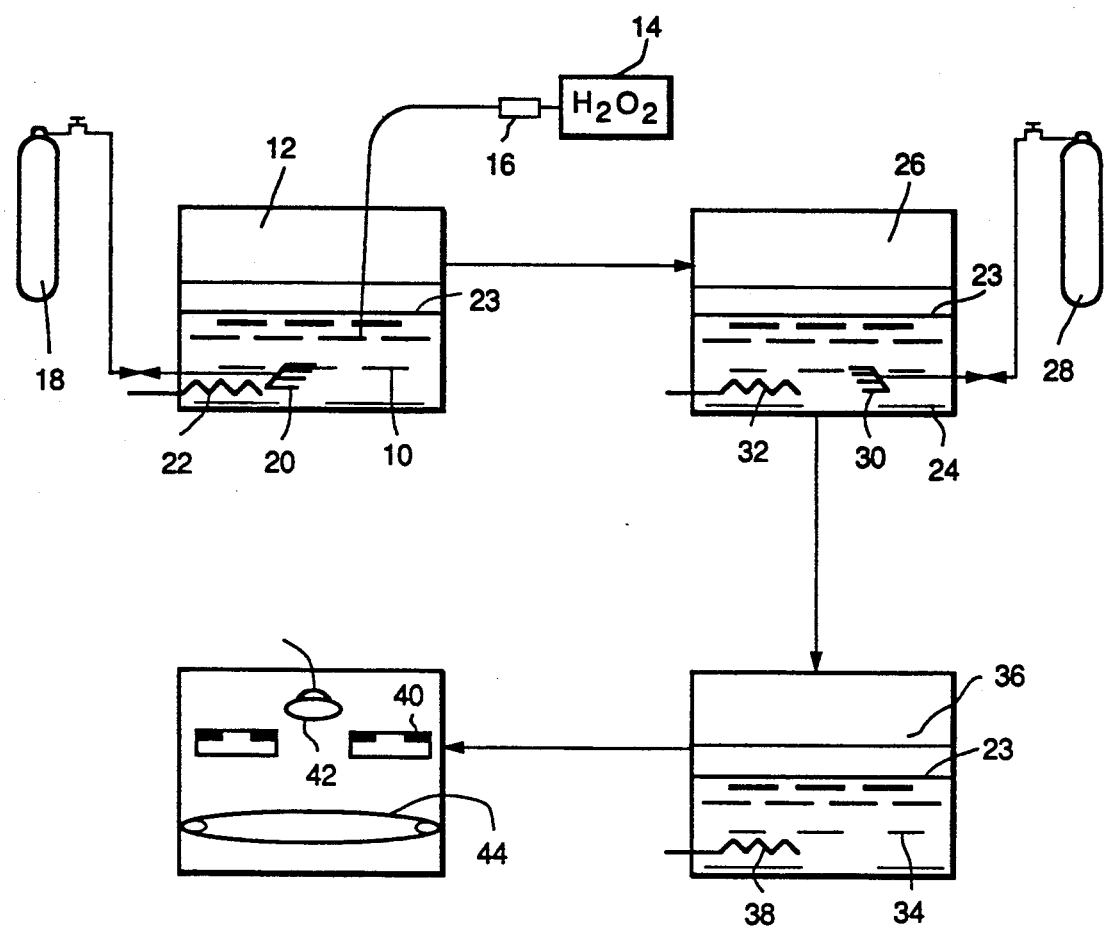
FIG. 1 is a schematic representation of an exemplary system for practicing the present invention.

The method and system of the present invention are effective for removing contaminants from a solid substrate while at the same time avoiding undesirable impact on the environment. The present invention is especially useful for removing flux residues and ionic species which contaminate surfaces after a soldering operation. These flux residues typically comprise resinous, waxy contaminants which are the breakdown products from the soldering operation. The substrates which are soldered comprise, for example, printed wiring boards, integrated circuits, electronic components, electronic devices, electronic connectors, or electronic cables. In accordance with the present invention, the by-products, such as carbon dioxide, nitrogen, and water, which are formed are non-hazardous and can be removed without having a negative environmental impact.

In accordance with the present method, there is first provided an initial reaction bath comprising a chosen liquid reaction medium, to which chosen reactants are added to form the final reaction bath. The chosen liquid reaction medium may be, for example, deionized water or other solvents for dissolving the oxidant and other additives. The term "final reaction bath" is used herein to mean the fluid composition to which the substrate to be cleaned is exposed. The term "initial reaction bath" refers to the initial fluids provided, to which additional constituents are added to form the final reaction bath, as described below.

The chosen oxidant is metered into the initial reaction bath to form the final reaction bath and is metered into the final reaction bath at a predetermined rate. The chosen oxidant comprises a material which is capable of oxidizing the contaminant to remove it from the substrate without having an adverse effect on the substrate. Oxidant materials which are suitable for use in practicing the present invention include, but are not limited to, known oxidants such as salts of hypochlorite, chlorite, chlorate, bromate, persulfate, perborate, and percarbonate. A preferred oxidant for use in practicing the present invention comprises hydrogen peroxide. While the following discussion focuses on the use of hydrogen peroxide, it is understood that the present invention is not limited to hydrogen peroxide but encompasses other oxidants as previously described. The chosen oxidant is metered into the initial and final reaction baths at a predetermined rate which is sufficient to provide effective levels of the oxidant which will react with and remove the contaminant from the substrate.

In a preferred embodiment of the present invention, the initial reaction bath comprises: (a) an alkaline compound in sufficient amount to provide a pH of 10.5 to 14.0 in the final reaction bath during treatment of the substrate; (b) a chosen wetting agent which is stable in the presence of the alkaline compound and hydrogen peroxide; and (c) deionized water. Hydrogen peroxide is metered into the initial reaction bath and the final reaction bath at a predetermined rate within the range of 0.004 milligrams of hydrogen peroxide per minute per gallon of reaction bath fluid to the saturation limit of hydrogen peroxide in the reaction bath or higher. The preferred metering rate is about 0.004 to 1500 milligrams of hydrogen peroxide per minute per gallon of reaction bath fluid, which provides a hydrogen peroxide concentration of about 0.01 to 4.0 percent in the final reaction bath. By metering the hydrogen peroxide into the reaction bath rather than adding it as a single large batch, a constant and higher level of hydrogen peroxide over time is obtained while consuming significantly less hydrogen peroxide, as discussed in further detail with reference to FIG. 4 herein. The hydrogen peroxide interacts with the contaminant to remove it from the substrate surface, and the hydrogen peroxide itself is decomposed into water and oxygen gas.

Optionally, the initial reaction bath and the final reaction bath are sparged with air or oxygen at a predetermined rate, such as about 0.001 to 1 standard cubic feet per minute for a hydrogen peroxide composition. The specific sparging rate varies depending on the specific oxidant used. As discussed in further detail with reference to FIG. 5 herein, this air or oxygen sparge results in a small but consistent improvement in maintaining increased levels of hydrogen peroxide over time. While not limiting the present invention to a particular theory of operation, it is believed that this effect is due to the fact that the oxygen in the air or oxygen alone retards the following spontaneous decomposition reaction:

$$2H_2O_2 \rightleftharpoons 2H_2O + O_2.$$

The substrate having contaminants thereon is placed on a substrate holder which is exposed to the final reaction bath into which hydrogen peroxide is continuously metered and air or oxygen is sparged to efficiently and consistently remove the contaminants from the substrate, while minimizing the amount of hydrogen peroxide which is required. Other means for imparting kinetic energy to the reaction bath may alternatively be used.

Optionally, if the substrate comprises metal, a metal-protective agent is added to protect the metal surface from attack by the hydrogen peroxide or other oxidant and alkali. The metal protective agent is unreactive with the hydrogen peroxide or oxidant and the alkaline compound and is present in sufficient amount to provide about 0.1 to 99 percent by weight in the final reaction bath, preferably 0.5 to 2.0 percent by weight.

The alkaline compound is added to the initial reaction bath to provide a pH of 10.5 to 14.0, preferably within the range of 11.5 to 14, in the final reaction bath. The alkaline compound may be, for example, sodium hydroxide or potassium hydroxide, with sodium hydroxide being most preferred. If sodium hydroxide is used, it is present preferably in the amount of about 0.2 to 0.5 percent by weight of the composition of the final reaction bath, but may be present in the amount of 0.1 to 99 percent by weight.

The wetting agent must be chosen to be compatible with the other components in the reaction bath. Conventional wetting agents such as sodium alkylaryl sulfonate and other organic synthetic detergents decompose rapidly in the presence of strong alkaline oxidizing/bleaching solutions such as the hydrogen peroxide composition of the present invention. This results in rapid decomposition of the hydrogen peroxide and excessive foaming in the solution. A preferred wetting agent for use in the present hydrogen peroxide composition comprises sodium 2-ethylhexyl sulfate (obtained from Niacet Co., Niagara Falls, N.Y.). It has good solubility, stability, and penetrating action in near-boiling alkaline and acid solutions, and is one of the few anionic surfactants stable in concentrated bleaching solutions. Other suitable wetting agents for practicing the present invention may comprise sodium metasilicate or short-chain branched surfactants. The wetting agent is used in the present invention in the amount from about 0.1 percent by weight of the composition of the final reaction bath, to the saturation limit of the wetting agent in the reaction bath, preferably from about 0.1 to 0.3 percent by weight.

If the substrate comprises a metal, such as in a printed wiring board, the metal surfaces must be protected from attack by the peroxide or oxidant and alkali in the reaction bath. The particular metal protective agent used depends on the specific metal being protected. For example, calcium and phosphorous compounds are used as protective agents for copper. The selection of the particular protective agent for a particular metal is known in the art and will not be detailed here. Suitable metal protective agents for practicing the present invention include sodium carbonate or sodium metasilicate. The metal protective agent is present in the amount of about 0.1 percent by weight of the composition of the final reaction bath to the saturation limit of the metal protective agent in the reaction bath, preferably from about 0.5 to 2.0 percent by weight. It should be noted that both sodium carbonate and sodium metasilicate have been found to affect the pH of the peroxide solution and must be taken into account when adjusting the pH of the final reaction bath.

The optimum operating temperature for a preferred embodiment of the present method to provide effective contaminant removal using hydrogen peroxide within a short period of time is within the range of 32° to 100° C. (90° to 212° F.). A preferred temperature range for use of the present composition is about 60° to 71° C. (140° to 160° F.). Within this range, flux contaminants may be removed in 1 to 3 minutes. The increased temperature promotes the reaction, improves penetration of the composition by softening gummy contaminants, and keeps particulates in suspension so that they do not deposit on the cleaned substrates. If other oxidants are used, other temperature ranges, or perhaps no heat, may be required.

The contaminants which can be removed in accordance with the present invention comprise organic materials which include, but are not limited to the residues left by commonly used soldering flux materials. These flux residues comprise oils, resins, and other organic materials. In addition, the present invention is effective in removing ionic species, such as those derived from an acid or halogen added to the flux. Further, since the present method and apparatus are effective for cleaving carbon-to-carbon bonds, they may be used for the removal of other organic compounds and other contaminants as well. Such materials, include, but are not limited to, oil, grease, lubricants, water soluble fluxes, organic acid fluxes, uncured photoresist, dyes or conductive inks. The contamination is typically in the form of a resinous layer, but it may be in the form of discrete particles.

The solid substrate from which contaminants can be removed in accordance with the present invention may comprise any material which is not adversely affected by the oxidant or alkaline components of the reaction bath. Such materials include, but are not limited to, polyimide laminates, epoxy/glass laminates, and aluminum oxide substrates which are used in printed wiring boards, silicon which is used in electronic devices, and copper or other conductors which are used in component loads, cables and connectors. The solid substrate may have a simple or complex configuration and may include interstitial spaces which are difficult to clean by known methods. The present invention is particularly well-suited for removing contaminants from high density electronic devices having very small open spaces (i.e., 5 mils or 0.0127 cm or less) requiring decontamination. The substrate may be in the form of a continuous layer or in the form of discrete particles.

The system for practicing the method of the present invention comprises:

(a) a chamber for containing a final reaction bath comprising a chosen oxidant, wherein an initial reaction bath is provided in the chamber and comprises a chosen liquid reaction medium for the chosen oxidant; and (b) means connected to the chamber, for metering the chosen oxidant into the initial reaction bath to form the final reaction bath, and for continuously metering the chosen oxidant into the final reaction bath.

Optionally, the present system may include means connected to the chamber, for sparging the initial and final reaction baths with air or oxygen. As a further option, the present system may include means located within the chamber for heating the final reaction bath.

In accordance with alternative embodiments of the present invention, spraying means is provided within the cleaning chamber, either above or below the surface of the reaction bath, to add kinetic energy to the reaction bath and thus improve the effectiveness of the present method in removing contaminants. Other means for imparting kinetic energy to the reaction bath, such as ultrasonic energy, may alternatively be used.

As an added feature of the present invention, after the substrate has been treated as described herein to remove contaminants, residual alkaline materials (alkali or alkali salts) remaining on the substrate are neutralized. Suitable neutralizing agents include a wide variety of weak acids, such as carboxylic acids. A preferred neutralization agent comprises hot carbonated water, which is applied at 32° to 71.1° C. (90° to 160° F.). The carbonated water may be formed by bubbling carbon dioxide into deionized water. The use of the carbonated water rinse keeps the rinse water below a pH of 9.5, which is the regulated limit for disposal in a sewer. After the neutralization step, the substrate is rinsed in hot water at 32° to 71.1° C. (90° to 160° F.), preferably with air agitation, and then dried, preferably with hot air. In an exemplary batch processing technique, in which contaminated substrates are loaded into a chamber and treated, in turn, with the present composition, neutralizing agent, water, and hot air, the following approximate processing times may typically be used:

| | Step | Time |
|---|---|---|
| a. | Exposure of contaminated substrate by present method | 3-10 minutes |
| b. | Neutralization | 3-5 minutes |
| c. | Hot water rinse | 4-6 minutes |
| d. | Hot air drying | 3-5 minutes |

The above-noted times are exemplary only for a hydrogen peroxide composition and may be changed as required. For example, these times may be increased when cleaning a complex substrate, such as a high density electronic device, using a hydrogen peroxide composition. These times may require substantial variation when other oxidants are used.

Alternatively, the present process may be practiced as an "in-line" process. The contaminated substrates are loaded into a rack and the rack is lowered in sequence into a series of chambers containing, respectively, the present composition, the neutralizing agent, and deionized water spraysers. As yet another alternative, this in-line processing may be accomplished by a conveyorized system.

After the substrate has been treated in accordance with the present invention, the substrate is removed from the chamber containing the reaction bath. The starting composition of the reaction bath is then re-established by the addition of hydrogen peroxide or other oxidant and, if necessary, the other constituents of the composition. Thus, the bulk cleaning solvent remains in place and does not require disposal. Rather, the composition is regenerated in situ by the addition of constituent materials as required.

As an added feature of the present invention, the present method removes metallic oxides from the substrate and thus serves also as a solder brightener. This eliminates the need for a secondary process, such as treatment with fluoroboric acid.

An exemplary system for practicing the present invention is shown schematically in FIG. 1. The reaction bath 10 as previously described is provided in chamber 12 as the initial reaction bath comprising the alkaline compound, wetting agent, and purified water. Hydrogen peroxide, for example, from container 14 is continuously metered by metering means 16 into the reaction bath 10. The metering means 16 may comprise, for example, a pump, such as a chemical metering pump obtained from Pulse Feeder, Inc. of Punta Gorda, Fla. The metering means 16 is adjusted so that the hydrogen peroxide is introduced into the reaction bath at a predetermined rate, for example about 0.004 to 1500 milligrams of hydrogen peroxide per minute per gallon of fluid in the reaction bath, which provides a constant concentration of hydrogen peroxide of about 0.01 to 4.0 percent. Optionally, air or oxygen from gas supply 18 is introduced through sparging means 20 into the reaction bath 10. The sparging means 20 may comprise known means, such as a manifold array comprising a pipe or tube with holes or openings at predetermined locations. The sparging means 20 is adjusted so that air or oxygen is introduced into the reaction bath at a rate of about 0.001 to 1 standard cubic feet per minute. Heating means 22 is provided within the reaction bath 10 to heat the reaction bath to a temperature within the range of about 32° to 71.1° C. (90° to 160° F.). Heating means 22 may comprise known means, such as a stainless steel immersion heaters obtained from Thermo-Coil Manufacturing of West Newton, Pa. The substrate to be treated is placed on a substrate holder 23, such as a parts fixture, which is attached to the inner walls of chamber 12 by brackets (not shown) or may be moveable within the chamber or may be lowered into the reaction bath 10 by known means (not shown). Alternatively, the substrate holder 23 may comprise a stand that rests on the bottom surface of the chamber 12.

Figure 2:
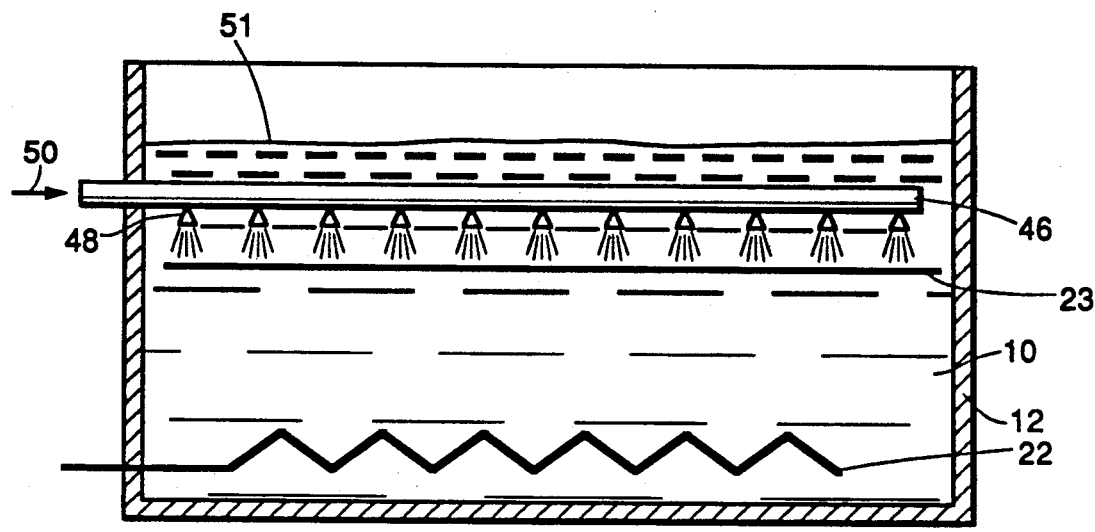
FIG. 2 is a schematic representation of a portion of a system in accordance with an alternative embodiment of the present invention in which spraying means is provided below the surface of the reaction bath.
Figure 3:
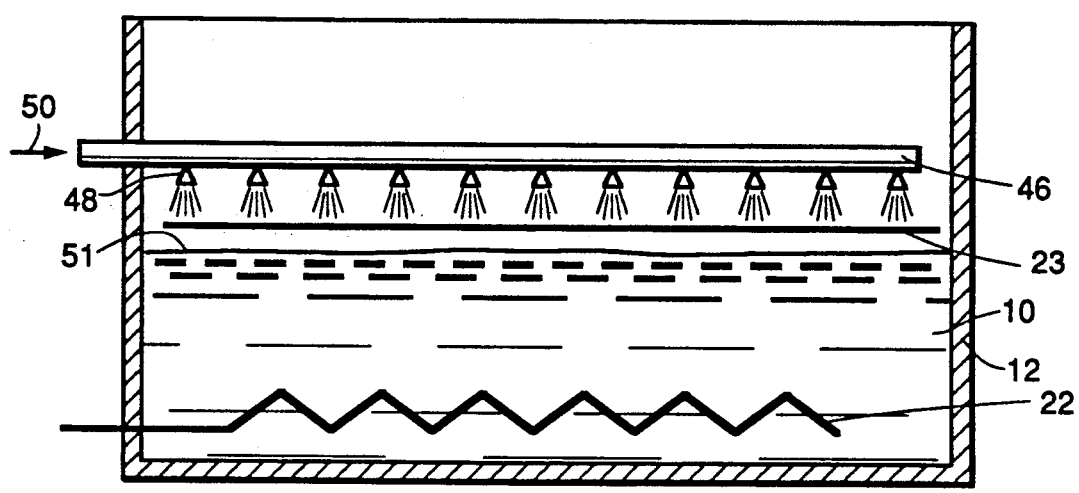
FIG. 3 is a schematic representation of a portion of a system in accordance with another alternative embodiment of the present invention in which spraying means is provided above the surface of the reaction bath.

Optionally, the chamber 12 may be provided with spraying means 46, which may be located below the surface of the reaction bath 10, as shown in FIG. 2, or above the surface of the reaction bath 10 as shown in FIG. 3. The spraying means 46 may comprise, for example, a manifold with a spray bank, i.e. a tube or pipe fitted with spray nozzles 48 at predetermined locations along the length thereof. The liquid to be sprayed, namely, the final reaction bath fluid, is introduced into the spraying means 46 at inlet 50. Means (not shown), such as pumps and tubing, are provided for transporting a portion of the final reaction bath to inlet 50. The nozzle must generate sufficient kinetic energy to the sprayed liquid to adequately clean the substrate. Nozzle pressures within the range of about 10 to 90 pounds per square inch (0.70 to 6.33 Kg/cm$^2$) have been found to be most useful. In addition, it has been found advantageous to use a nozzle which provides a conical spray pattern of about 45 to 90 degrees. Moreover, a nozzle which provides a large droplet size, for example about 1800 micrometers in diameter, has also been found to be advantageous for below-liquid spray. A nozzle meeting these requirements is commercially available from Spraying Systems Corporation of Wheaton, Ill.

In the embodiment of the present invention shown in FIG. 2, the spraying means 46 is located below the upper surface 51 of the reaction bath 10. The entire spraying means 46, or at least the nozzles 48, are submerged within the reaction bath 10. The substrate holder 23 is located within the reaction bath 10 below the spraying means 46 and at a predetermined distance from the nozzles 48. This distance is selected to be close enough to the nozzles so that the sprayed liquid has sufficient kinetic energy to effectively clean the substrate and far enough away from the nozzles to accommodate large-dimensioned hardware configurations. A distance of about 0.25 to 4.0 inches (0.6 to 10.2 cm) between the substrate holder 23 and the nozzle 48 has been found to be useful. The substrates to be cleaned are placed on the substrate holder 23 which is configured to hold the substrate in place when it is subjected to the force of the spray from the nozzles 48. In addition, it is advantageous to locate the substrate in relation to the nozzle such that the sprayed liquid from the nozzle 48 strikes the periphery of a mounted component, for example, so that the liquid can effectively be forced into the small gap under the component. For the sake of simplicity, the metering means 16 and sparging means 20 shown in FIG. 1 have been omitted from FIG. 2 but are intended to be included. As previously noted, other means for imparting kinetic energy to the reaction bath may be used in place of the spraying means.

In the embodiment of the present invention shown in FIG. 3, the spraying means 46 with nozzles 48 is located above the upper surface 51 of the reaction bath 10. The substrate holder 23 is also located above the surface 51 and below the spray means 46 at a predetermined distance from the nozzles 48. With the exception of the location of the spraying means 46 and the substrate holder 23, the details discussed above with regard to FIG. 2 apply as well to FIG. 3. As previously noted, other means for imparting kinetic energy to the reaction bath may be used in place of the spraying means.

In a preferred embodiment of the present invention, after exposure of the substrate to the reaction bath containing hydrogen peroxide, the substrate is treated, in turn, with neutralizing agent, water, and hot air as previously described. Returning now to FIG. 1, there is shown deionized water 24 which is provided in chamber 26. Carbon dioxide from gas supply 28 is introduced into the deionized water 24 by sparging manifold 30 at a rate of about 1 standard cubic foot per minute to produce carbonated water. Heater 32 is provided in deionized water 24 to heat the latter to a temperature of about 32° to 71.1° C. (90° to 160° F.). The hot carbonated water in chamber 26 neutralizes residual alkaline material on the substrate which has been treated in reaction bath 10. Other neutralizing agents, for example weak acids such as carboxylic acids, may be used.

A final rinse bath comprising deionized water 34 is provided in chamber 36. Heater 38 is provided in deionized water 34 to heat the latter to a temperature of about 32° to 71.1° C. (90° to 160° F.).

Drying of the treated substrate is accomplished by exposing it to hot air from air knives 40 and/or to an infrared heater 42. The substrates to be dried may optionally be placed on a conveyor belt 44 to improve the efficiency of this process step.

Optionally, the substrate holder 23 containing the substrates to be treated may be placed on a conveyor belt which moves in turn, from the reaction bath to the neutralizing bath to the final water rinse to the drying chamber.

Figure 4:
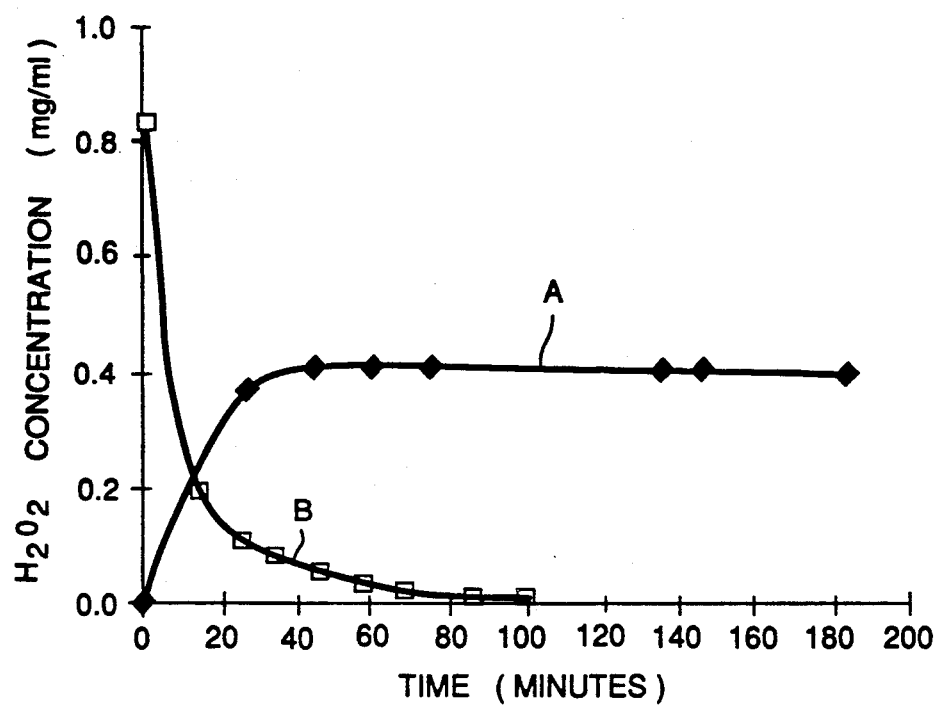
FIG. 4 presents a set of curves showing the change in hydrogen peroxide concentration as a function of time, in accordance with the present invention as compared to a prior process.

Turning now to FIG. 4, there is presented a set of curves indicating the change in hydrogen peroxide concentration as a function of time in accordance with the present invention (curve A) as compared to a prior process (curve B). In accordance with the prior process, a single large aliquot of hydrogen peroxide was added to the reaction bath (i.e., batch addition). In the batch addition, the average concentration realized in the bath over a period of 100 minutes was 0.07 mg/ml, which was approximately 0.1 of the initial value, and 28 grams of hydrogen peroxide were consumed. By contrast, when hydrogen peroxide was continuously metered into the reaction bath with air sparging in accordance with the present invention, the average concentration of hydrogen peroxide in the reaction bath over a period of 100 minutes was 0.4 mg/ml. The latter value is about six times the value achieved in the batch addition method. In addition, in the present method, only 23 grams of hydrogen peroxide were consumed during this same time period, compared to the 28 grams consumed in the prior method. Thus, as indicated in FIG. 4, in accordance with the present invention, the hydrogen peroxide in the final reaction bath is maintained at an effective level for an extended period of time, which enables the contaminants to be removed from the substrate in a uniform and controlled manner.

Figure 5:
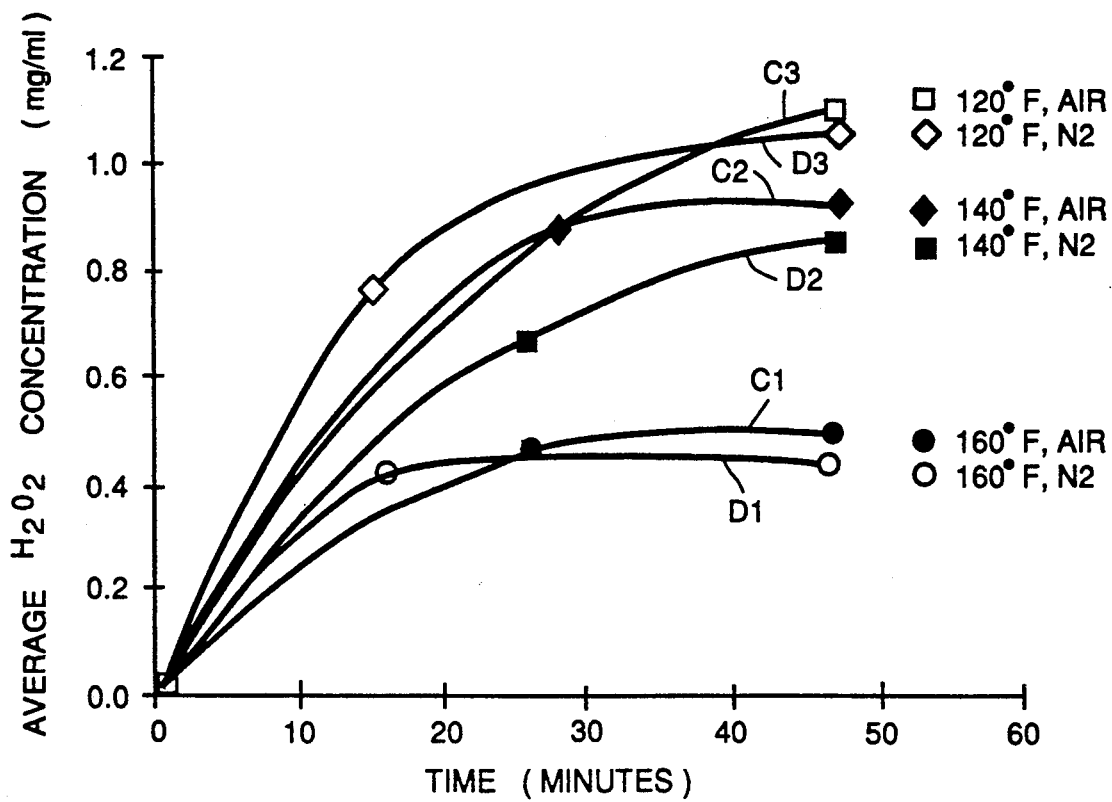
FIG. 5 presents a set of curves showing the effect of air and nitrogen as sparge gases on hydrogen peroxide concentration in the reaction bath at various temperatures.

FIG. 5 presents a set of curves showing the effect of air and nitrogen as the sparge gas on the hydrogen peroxide concentration in the final reaction bath at various temperatures. As shown in FIG. 5, the use of air as the sparge gas (in curves C1, C2 and C3) produces a small but consistent improvement in the steady-state hydrogen peroxide concentration at all temperatures studied, as compared to the use of nitrogen as the sparge gas (in curves D1, D2, and D3).

Examples of practice of the present invention are as follows.

EXAMPLE 1

Test Samples

The testing described below was performed on IPC-B-36 printed wiring assemblies (PWA's), obtained from Cartel Electronics of Placentia, Calif., with four 68 input/output ceramic leadless chip carriers (LCC's) electronic components mounted on each PWA. Standoffs under the LCC's provided a 5 mil (0.013 cm) air gap between the PWA surface and the bottom of the LCC's. LCC's were mounted to the PWA's by vapor phase reflow soldering with a rosin mildly activated (RMA) flux in solder paste. The PWA's were subsequently subjected to the wave solder process to simulate through-hole component soldering, which applies additional rosin activated (RA) flux to the PWA.

Test Solution

The test solution used to clean the test samples as described below comprised a composition of the present invention having the following constituents in percent by weight in 45 gallons of deionized water heated to 160° F. (71.1° C.).

1.0% hydrogen peroxide
0.2% wetting agent (2-ethylhexyl sulfate)
0.3% sodium hydroxide
0.5% sodium metasilicate
1.0% sodium carbonate General Test Procedure The samples to be cleaned were treated as previously described herein, using a reaction phase, i.e. treatment with the composition of the present invention, followed by two rinse phases and a drying phase. The removal of flux from the test samples occurred in the reaction phase. The rinsing and drying phases were performed in a commercially designed polypropylene constructed in-line water cleaning system purchased from Westek of Arcadia, Calif. The first stage rinse consisted of deionized water heated to 150° F. (65.5° C.). The second stage rinse consisted of deionized water heated to 140° F. (60° C.). The drying stage, consisting of infrared heating and compressed air, was operated at 160° F. (71.1° C.). The test samples were processed above liquid level through the phases of this system on a conveyor moving at 2.5 ft/min. (0.76 meter/min.). This equates to approximately 1 minute in each phase. The rinse water was applied to the test PWA's by pumping through spray nozzles mounted directly above and below and impinging on the conveyor.

After cleaning of the test samples, the extent of entrapped flux was determined by removing the LCC's by hot air reflow techniques, followed by visual inspection of the exposed area. Percentage of flux removed was visually quantified by comparison to uncleaned PWA's considered to have 100% flux remaining. All surface flux (i.e., flux in areas not covered by LCC's) was removed from the test samples treated in accordance with the present invention.

Specific Test Procedure and Results

This example presents data showing the effectiveness of the present invention in removing entrapped flux from the test samples described above and provides comparative data for two nozzle systems, namely a needle nozzle spray system and a cone spray nozzle system. The latter was obtained from Westek of Arcadia, Calif. The needle nozzle spray system consisted of four 0.5 inch (1.27 cm) diameter, 16 inch (40.6 cm) long stainless steel tubes mounted in parallel with fourteen 0.054 inch (0.14 cm), 1 inch (2.54 cm) long stainless steel spray needles, spaced 1 inch (2.54 cm) apart, per tube attached by brazing. The tubes were mounted above the hardware to be cleaned with the needle nozzles pointing down onto the hardware in a perpendicular fashion. The test samples were treated in a system having the configuration described in FIG. 2 herein, having spraying means within the reaction bath, below the liquid level.

The test data presented in TABLE I shows the percent of entrapped flux removed by the two nozzle spray systems with various lengths of exposure time.

TABLE I

FLUX REMOVAL VERSUS EXPOSURE TIME WITH VARIED NOZZLE DESIGN

| Spray Method | Spray Pressure | Flux Removal Exposure Time (minutes) | | | |
|---|---|---|---|---|---|
| | | 3 | 6 | 10 | 15 |
| Needle nozzles | 50 psi | <50% | 60%–70% | 85%–95% | 99%–100% |
| Cone nozzles | 50 psi | 100% | 100% | 100% | 100% |
| Cone nozzle | 30 psi | 100% | 100% | 100% | 100% |
| Cone nozzle | 15 psi | 98% | 100% | 100% | 100% |

These test results show that the present invention is very effective in removing entrapped solder flux from beneath surface mounted devices (i.e., LCC's) on PWA's with 5 mil (0.013 cm) air gaps. The effectiveness of the present process is improved by using high flow rate, cone spray pattern nozzles.

EXAMPLE 2

Test Samples

The test samples were the same as described in Example 1 above.

Test Solution

The test solution used to clean the test samples was the same as described in Example 1 above.

General Test Procedure

The general test procedure followed was the same as described in Example 1 above.

Specific Test Procedure and Results

This example presents data showing the effectiveness of the present invention in removing entrapped flux from the test samples described above and provides comparative data for cone nozzle spray systems above liquid level, as described in FIG. 3 herein, and below liquid level, as described in FIG. 2 herein. A cone nozzle spray system obtained from Westek of Arcadia, Calif. was used.

The test data presented in TABLE II shows the percent of entrapped flux removed by the two spray methods at various spray pressures.

TABLE II

FLUX REMOVAL VERSUS SPRAY PRESSURE FOR VARIED NOZZLE POSITION

| Spray Method | Exposure time | Flux Removal Spray Pressure | | |
|---|---|---|---|---|
| | | 15 psi | 30 psi | 50 psi |
| Below Liquid | 3 minutes | 98% | 100% | 100% |
| Above Liquid | 3 minutes | 98% | 100% | 100% |

These test results show that the present invention is effective in removing entrapped solder flux from beneath surface mounted devices (i.e., LCC'S) on PWA's with 5 mil (0.013 cm) air gaps, using either above liquid level or below liquid level nozzles.

Test Samples

The testing described below was performed on glass cover slides bonded onto glass baseplates with 3 millinch (0.008 cm) air gaps between the cover slide and base plate to simulate surface mounted electronic devices on printed circuit boards. Rosin based soldering flux was administered into the air gaps between the cover slides and baseplates, which were then baked for five minutes at 450° F. (232° C.) to simulate the soldering operation. The extent of flux entrapped was determined for each test sample by visually quantifying the percentage of surface area under the cover slide that was covered by flux.

Test Solution

The test solution used to clean the test samples as describe below comprised a composition of the present invention having the following constituents in percent by weight in deionized water heated to 160° F. (71.1° C.).

4.0% hydrogen peroxide
0.2% wetting agent (2-ethylhexyl sulfate)
0.3% sodium hydroxide
0.5% sodium metasilicate 1.0% sodium carbonate

General Test Procedure

The samples to be cleaned were treated as previously described in Example 1, General Test Procedure, using a reaction phase, i.e., treatment with the composition of the present invention, followed by two rinse phases and a drying phase. The removal of flux from the test samples occurred in the reaction phase. The first and second stage rinses consisted of deionized water heated to 140° F. (60° C.). After cleaning of the test samples, the extent of flux entrapped was visually determined by visual quantification of the percentage of flux-covered surface area remaining between the cover slide and the baseplate.

Specific Test Procedure and Results

This example presents data showing the significant improvement in removing entrapped flux from the test samples which was achieved by using spraying means in the method of the present invention. The test data presented in Table III shows the percent of entrapped flux removed from the test samples treated in accordance with the method of the present invention without spraying means (Test Sample Nos. 1–5) and in accordance with the method of the present invention with spraying means (Test Sample Nos. 6–10). The spraying means comprised the needle nozzle spray system described in Example 1. The spraying means was located below the liquid level of the reaction bath as shown in FIG. 2 herein.

TABLE III

FLUX REMOVAL WITHOUT AND WITH SPRAYING MEANS

| Test Sample No. | Flux Removal Without Spray | Flux Removal With Spray |
|---|---|---|
| 1 | 35% | |
| 2 | 15% | |
| 3 | 25% | |
| 4 | 45% | |
| 5 | 40% | |
| 6 | | 98% |
| 7 | | 100% |
| 8 | | 95% |
| 9 | | 100% |
| 10 | | 99% |

These test results show that the present invention was significantly more effective in removing entrapped flux when a spraying means was used.

While the previous discussion has focused on the use of the present composition and method to remove flux residues from solid substrates, it is not intended to limit the present invention to this particular contaminant. Rather, it is intended to include within the scope of the present invention the removal from a substrate of other organic materials besides flux residues and other contaminants besides organic materials. For example, the present composition and method may be used to remove contaminants comprising inorganic materials, such as ionic species.

Having thus described exemplary embodiments of the present invention, it should be noted by those skilled in the art that the disclosures within are exemplary only and that various other alternatives, adaptations and modifications may be made within the scope of the present invention. Accordingly, the present invention is not limited to the specific embodiments as illustrated herein, but is only limited by the following claims.

What is claimed is:

1. A system for removing contaminants from a chosen solid substrate by reaction with a chosen oxidant said system comprising:
    (a) a first chamber for containing a final reaction bath, wherein an initial reaction bath is provided in said first chamber and comprises a chosen liquid reaction medium for said chosen oxidant; and
    (b) means connected to said first chamber, for metering said chosen oxidant into said initial reaction bath to form said final reaction bath and for continuously metering said chosen oxidant into said final reaction bath wherein said chosen ocidant reacts with and removes said contaminants.

2. The system of claim 1 further comprising means located within said first chamber for heating said final reaction bath.

3. The system of claim 1 further comprising means connected to said first chamber for imparting kinetic energy to said initial reaction bath and said final reaction bath to retard the spontaneous decomposition of said chosen oxidant.

4. The system of claim 3 wherein said means for imparting kinetic energy to said reaction baths comprises means for sparging said reaction baths with air or oxygen.

5. The system of claim 1 further comprising spraying means for providing said final reaction bath in the form of a spray.

6. The system of claim 5 wherein said spraying means and said substrate are located within said final reaction bath and said spraying means is located above said substrate.

7. The system of claim 5 wherein said spraying means and said substrate are located above the upper surface of said final reaction bath and said spraying means is located above said substrate.

8. A system for removing contaminants from a chosen solid substrate comprising:
    (a) a first chamber for containing a final reaction bath, wherein an initial reaction bath is provided in said first chamber and comprises:
        (1) an alkaline compound in sufficient amount to provide a pH of 10.5 to 14.0 in said final reaction bath;
        (2) a chosen wetting agent which is stable in the presence of said alkaline compound and hydrogen peroxide; and
        (3) deionized water;
    (b) means connected to said first chamber for continuously metering hydrogen peroxide into said initial reaction bath to form said final reaction bath and for continuously metering hydrogen peroxide into said final reaction bath wherein said hydrogen peroxide reacts with and removes said contaminants;
    (c) means connected to said first chamber for sparging said initial reaction bath and said final reaction bath with air or oxygen to retard the spontaneous decomposition of said hydrogen peroxide; and
    (d) means located within said first chamber for heating said final reaction bath.

9. The system of claim 8 wherein said means for metering provides said hydrogen peroxide into said final reaction bath at a rate of about 0.004 milligrams of hydrogen peroxide per minute per gallon of final reaction bath fluid or higher.

10. The system of claim 8 wherein said means for sparging provides said air or oxygen into said final reaction bath at a rate within the range of about 0.0001 to 1 standard cubic feet per minute.

11. The system of claim 8 wherein said means for heating provides a temperature within the range of 32° to 100° C. (90° to 212° F.) in said final reaction bath.

12. The system of claim 8 further comprising means for holding said substrate for exposure to said final reaction bath.

13. The system of claim 8 further comprising spraying means for providing said final reaction bath in the form of a spray.

14. The system of claim 13 wherein said spraying means and said substrate are located within said final reaction bath and said spraying means is located above said substrate.

15. The system of claim 13 wherein said spraying means and said substrate are located above the upper surface of said final reaction bath and said spraying means is located above said substrate.

16. A system for removing contaminants from a chosen solid substrate comprising:
   (a) a first chamber for containing a final reaction bath, wherein an initial reaction bath is provided in said chamber and comprises:
      (1) an alkaline compound in sufficient amount to provide a pH of 10.5 to 14.0 in said final reaction bath;
      (2) a chosen wetting agent which is stable in the presence of said alkaline compound and hydrogen peroxide; and
      (3) deionized water;
   (b) means connected to said first chamber for continuously metering hydrogen peroxide into said initial reaction bath to form said final reaction bath and for continuously metering hydrogen peroxide into said final reaction bath wherein said hydrogen peroxide reacts with and removes said contaminants;
   (c) means connected to said first chamber for sparging said initial reaction bath and said final reaction bath with air or oxygen to retard the spontaneous decomposition of said hydrogen peroxide;
   (d) means located within said first chamber for heating said final reaction bath;
   (e) means for neutralizing residual said alkaline compound or products thereof on said substrate;
   (f) means for rinsing said substrate with water; and
   (g) means for drying said substrate.

17. The system of claim 16 wherein said means for neutralizing comprises:
   (a) a second chamber for containing said substrate;
   (b) carbonated water contained in said second chamber; and
   (c) means for heating said carbonated water.

18. The system of claim 17 wherein said carbonated water is provided by introducing carbon dioxide gas into deionized water in said second chamber.

19. The system of claim 16 wherein said means for rinsing comprises:
   (a) a third chamber for containing said substrate;
   (b) deionized water contained in said third chamber; and
   (c) means for heating said deionized water, located within said deionized water.

20. The system of claim 16 wherein said means for drying comprises:
   (a) a fourth chamber for containing said substrate;
   (b) means within said fourth chamber for directing hot air at said substrate.

21. The system of claim 20 further comprising means within said fourth chamber for directing infrared radiation at said substrate.

22. The system of claim 20 further comprising a conveyor belt for moving said substrate through said fourth chamber.

23. The system of claim 16 further comprising conveyor means for moving said substrate from said first chamber to said means for neutralizing, to said means for rinsing, to said means for drying.

* * * * *